(12) United States Patent
Li et al.

(10) Patent No.: US 12,538,674 B2
(45) Date of Patent: Jan. 27, 2026

(54) DISPLAY APPARATUS AND ELECTRONIC DEVICE WITH AREA BETWEEN LIGHT-TRANSMITTING WIRES FILLED WITH LIGHT-TRANSMITTING BLOCKS

(71) Applicant: GUANGDONG OPPO MOBILE TELECOMMUNICATIONS CORP., LTD., Guangdong (CN)

(72) Inventors: Zhilin Li, Guangdong (CN); Shilin Yuan, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 616 days.

(21) Appl. No.: 18/059,143

(22) Filed: Nov. 28, 2022

(65) Prior Publication Data

US 2023/0089394 A1 Mar. 23, 2023

Related U.S. Application Data

(63) Continuation of application No. PCT/CN2021/087197, filed on Apr. 14, 2021.

(30) Foreign Application Priority Data

Jun. 8, 2020 (CN) .......................... 202010514980.2
Jun. 8, 2020 (CN) .......................... 202021041149.1

(51) Int. Cl.
*H10K 59/131* (2023.01)
*H10K 59/80* (2023.01)
*H10K 59/65* (2023.01)

(52) U.S. Cl.
CPC ..... *H10K 59/131* (2023.02); *H10K 59/80518* (2023.02); *H10K 59/65* (2023.02); *H10K 59/80* (2023.02); *H10K 59/879* (2023.02)

(58) Field of Classification Search
CPC .......... H10K 59/131; H10K 59/80518; H10K 59/65; H10K 59/879; H10K 59/80
See application file for complete search history.

(56) References Cited

U.S. PATENT DOCUMENTS

| | | | |
|---|---|---|---|
| 2005/0145861 A1* | 7/2005 | Kawakami | H10K 59/123 257/88 |
| 2011/0169720 A1* | 7/2011 | Hwang | H10K 59/121 345/76 |

(Continued)

FOREIGN PATENT DOCUMENTS

| | | |
|---|---|---|
| CN | 208607570 | 3/2019 |
| CN | 110047846 | 7/2019 |

(Continued)

OTHER PUBLICATIONS

CNIPA, Notification to Grant Patent Right for Invention for CN Application No. 202021041149.1, Dec. 4, 2020.

(Continued)

*Primary Examiner* — Lex H Malsawma
(74) *Attorney, Agent, or Firm* — Hodgson Russ LLP

(57) ABSTRACT

Provided are a display apparatus and an electronic device. A first display area of the display apparatus comprises: a pixel layer; an anode layer, which comprises multiple reflective anodes; multiple light-transmitting wires, wherein each light-transmitting wire is electrically connected to one or more reflective anodes, and the multiple light-transmitting wires are arranged at intervals; and multiple light-transmitting filling blocks, wherein each light-transmitting filling block is arranged between two light-transmitting wires that are spaced apart, and the difference between optical parameters of the light-transmitting filling blocks and the light-transmitting wires is less than a preset parameter threshold value.

20 Claims, 7 Drawing Sheets

(56) References Cited

U.S. PATENT DOCUMENTS

| | | | | |
|---|---|---|---|---|
| 2015/0137101 | A1* | 5/2015 | Choi | H10K 59/878 |
| | | | | 257/40 |
| 2016/0126494 | A1* | 5/2016 | Jung | H10K 59/121 |
| | | | | 438/23 |
| 2016/0172633 | A1* | 6/2016 | Ahn | H10K 59/121 |
| | | | | 257/40 |
| 2016/0351645 | A1* | 12/2016 | You | H10K 59/121 |
| 2017/0148861 | A1* | 5/2017 | Kim | H10K 71/00 |
| 2017/0179441 | A1 | 6/2017 | Lee et al. | |
| 2019/0130822 | A1* | 5/2019 | Jung | H10K 59/65 |
| 2019/0362678 | A1* | 11/2019 | Shin | G09G 3/3266 |
| 2020/0117034 | A1* | 4/2020 | Yin | G06F 1/1605 |
| 2021/0013298 | A1* | 1/2021 | Her | H10K 59/353 |
| 2021/0249624 | A1 | 8/2021 | Lou et al. | |
| 2021/0384266 | A1 | 12/2021 | Zhao et al. | |

FOREIGN PATENT DOCUMENTS

| | | |
|---|---|---|
| CN | 110504287 | 11/2019 |
| CN | 110648622 | 1/2020 |
| CN | 110706649 | 1/2020 |
| CN | 110767835 | 2/2020 |
| CN | 110783487 | 2/2020 |
| CN | 111146362 | 5/2020 |
| CN | 111180493 | 5/2020 |
| CN | 111223912 | 6/2020 |

OTHER PUBLICATIONS

WIPO, International Search Report and Written Opinion for PCT/CN2021/087197, Jul. 21, 2021.

CNIPA, First Office Action for CN Application No. 202010514980.2, Dec. 2, 2024.

CNIPA, Notification to Grant Patent Right for Invention for CN Application No. 202010514980.2, Feb. 21, 2025.

EPO, Extended European Search Report for EP Application No. 21820952.6, Oct. 25, 2023.

* cited by examiner

DISPLAY APPARATUS AND ELECTRONIC DEVICE WITH AREA BETWEEN LIGHT-TRANSMITTING WIRES FILLED WITH LIGHT-TRANSMITTING BLOCKS

CROSS REFERENCE OF RELATED APPLICATIONS

The present disclosure is a continuation of International Patent Application No. PCT/CN2021/087197, filed Apr. 14, 2021, which claims priority to Chinese Patent Application No. 202010514980.2, filed Jun. 8, 2020, and priority to Chinese Patent Application No. 202021041149.1, filed Jun. 8, 2020. The entire disclosures of the aforementioned applications are incorporated herein by reference.

TECHNICAL FIELD

The present disclosure relates to the electronic technical field, and in particularly to a display apparatus and an electronic device.

DESCRIPTION OF RELATED ART

With the development of communication technology, an electronic device such as smartphone is more and more popular. During using of the electronic device, the electronic device displays pictures through a display screen thereof.

For achieving better display effect and user experience, a front camera is set on the back of the display screen and the display screen is provided with a light-transmitting display area corresponding to the front camera. The front camera acquires acquire an external optical signal passing through the light-transmitting display area for imaging, while the light-transmitting display area can also display images, thus realizing both a full-screen display and meeting the requirement of the front camera.

SUMMARY

An embodiment of the present disclosure provides a display apparatus, including a first display area and a second display area adjacent to the first display area, a light transmittance of the first display area being greater than that of the second display area, the first display area including: a pixel layer, including multiple first pixels; an anode layer, adjacent to the pixel layer, the anode layer including multiple reflective anodes electrically connected to the multiple first pixels in one-to-one correspondence; multiple light-transmitting wires, each of the multiple light-transmitting wires being electrically connected to one or more of the multiple reflective anodes, and the multiple light-transmitting wires being spaced from each other; and multiple light-transmitting filling blocks, each of the multiple light-transmitting filling blocks being arranged between each two spaced light-transmitting wires of the multiple light-transmitting wires, and differences in optical parameters of each of the multiple light-transmitting filling blocks and optical parameters of each of the multiple light-transmitting wires being smaller than respective preset parameter thresholds.

An embodiment of the present disclosure provides another display apparatus, including a first display area and a second display area adjacent to the first display area, a light transmittance of the first display area being greater than that of the second display area, the first display area including: a pixel layer, including multiple first pixels; an anode layer, adjacent to the pixel layer, and the anode layer including multiple reflective anodes electrically connected to the multiple first pixels in one-to-one correspondence; a light-transmitting insulating layer, arranged a side of the anode layer facing away the pixel layer; multiple light-transmitting wires, each of the multiple light-transmitting wires being electrically connected to one or more of the multiple reflective anodes, and the multiple light-transmitting wires being spaced from each other; and multiple light-transmitting filling blocks, each of the multiple light-transmitting filling blocks being arranged between each two spaced light-transmitting wires of the multiple light-transmitting wires, and differences in optical parameters of each of the multiple light-transmitting filling blocks and optical parameters of each of the multiple light-transmitting wires being smaller than differences in optical parameters of the light-transmitting insulating layer and the optical parameters of each of the multiple light-transmitting wires, respectively.

An embodiment of the present disclosure provides a further display apparatus, including a first display area and a second display area adjacent to the first display area, a light transmittance of the first display area being greater than that of the second display area, the first display area including: a pixel layer, including multiple first pixels; an anode layer, adjacent to the pixel layer, the anode layer including multiple reflective anodes electrically connected to the multiple first pixels in one-to-one correspondence; multiple first drive units, each of the multiple first drive units electrically being connected to one or more of the multiple reflective anodes, and a projection of each of the multiple first drive units on the anode layer is located within one of the multiple reflective anodes; multiple light-transmitting wires, each of the multiple light-transmitting wires electrically connected to the multiple first drive units, and the multiple light-transmitting wires being spaced from each other; and multiple light-transmitting filling blocks, each of the multiple light-transmitting filling blocks being arranged between each two spaced light-transmitting wires of the multiple light-transmitting wires, and differences in optical parameters of each of the multiple light-transmitting filling blocks and optical parameters of each of the multiple light-transmitting wires being smaller than respective preset parameter thresholds.

An embodiment of the present disclosure provides an electronic device, including: the display apparatus above mentioned; and a camera including a lens, the lens being arranged facing towards the first display area of the display apparatus, and the camera configured to acquire an external optical signal transmitted through the first display area for imaging.

BRIEF DESCRIPTION OF DRAWINGS

In order to illustrate technical solutions in embodiments of the present disclosure more clearly, a brief introduction of accompanying drawings required to be used in the description of the embodiments is made hereinafter.

DETAILED DESCRIPTION OF EMBODIMENTS

Figure 1:
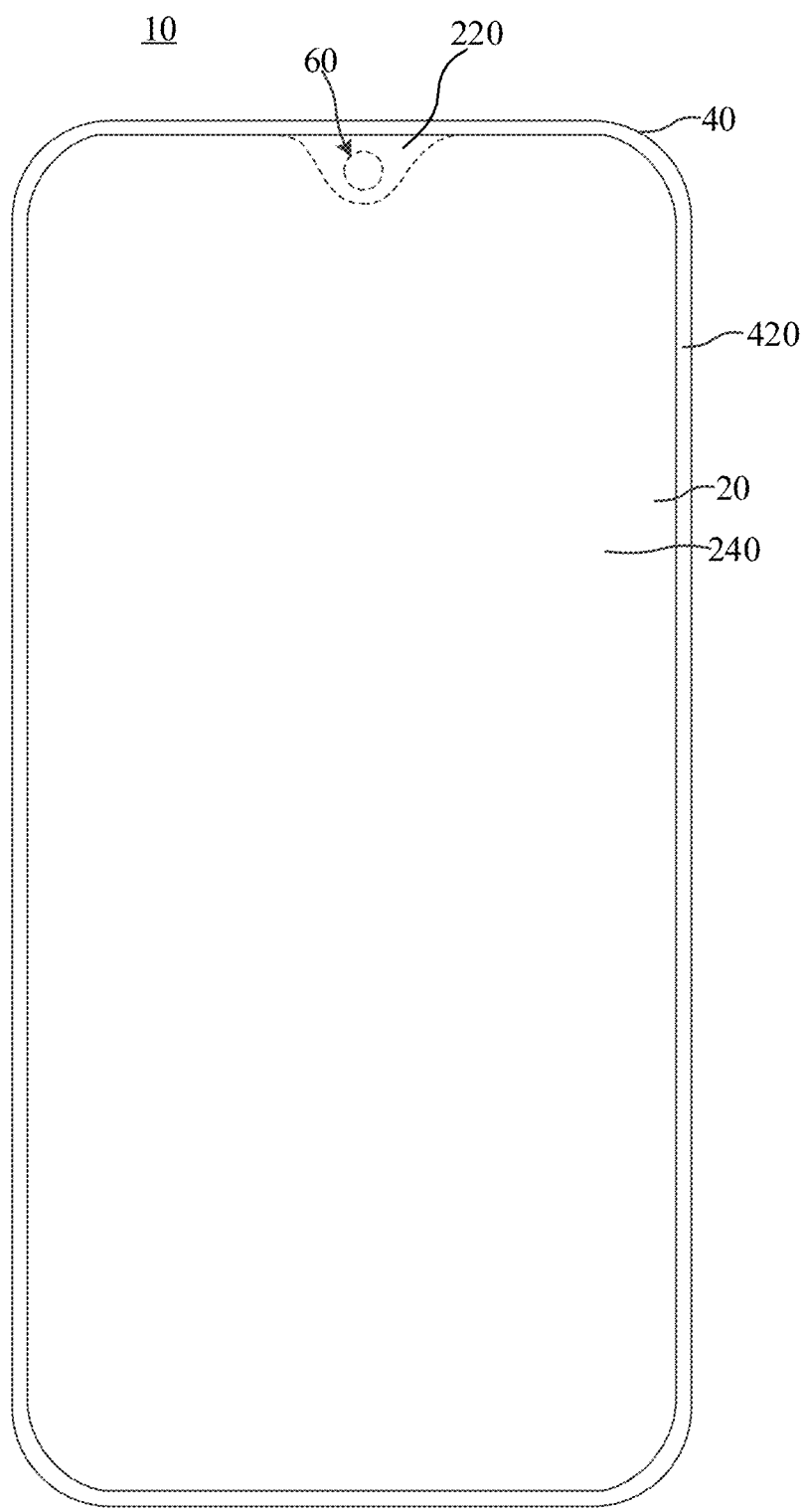
FIG. 1 illustrates a first schematic structural view of an electronic device according to an embodiment of the present disclosure.

An embodiment of the present disclosure provides a display apparatus, including a first display area and a second display area adjacent to the first display area, a light transmittance of the first display area being greater than that of the second display area, the first display area including: a pixel layer, including multiple first pixels; an anode layer, adjacent to the pixel layer, and the anode layer including multiple reflective anodes electrically connected to the multiple first pixels in one-to-one correspondence; multiple light-transmitting wires, each of the multiple light-transmitting wires being electrically connected to one or more of the multiple reflective anodes, and the multiple light-transmitting wires being spaced from each other; and multiple light-transmitting filling blocks, each of the multiple light-transmitting filling blocks being arranged between each two spaced light-transmitting wires of the multiple light-transmitting wires, and differences in optical parameters of each of the multiple light-transmitting filling blocks and optical parameters of each of the multiple light-transmitting wires being smaller than respective preset parameter thresholds.

In an embodiment of the present disclosure, each of the multiple light-transmitting wires has a first refractive index and a first extinction coefficient, and each of the multiple light-transmitting filling blocks has a second refractive index and a second extinction coefficient; and the first refractive index is equal to the second refractive index, or a difference between the first refractive index and the second refractive index is smaller than a preset refractive index threshold; and the first extinction coefficient is equal to the second extinction coefficient, or a difference between the first extinction coefficient and the second extinction coefficient is smaller than a preset extinction coefficient threshold.

In an embodiment of the present disclosure, the multiple light-transmitting wires are arranged in the anode layer, and the multiple light-transmitting wires are spaced from the multiple reflective anodes.

In an embodiment of the present disclosure, the first display area further includes a light-transmitting insulating layer, and the light-transmitting insulating layer is adjacent to the anode layer and arranged on a side of the anode layer facing away from the pixel layer; and the multiple light-transmitting wires are arranged on a side of the light-transmitting insulating layer facing away from the anode layer, the light-transmitting insulating layer is provided with via holes, and the multiple light-transmitting wires are electrically connected to the multiple reflective anodes through connecting wires arranged in the via holes.

In an embodiment of the present disclosure, orthogonal projections of the connecting wires on the light-transmitting layer are located within the multiple reflective anodes, respectively.

An embodiment of the present disclosure provides another display apparatus, including a first display area and a second display area adjacent to the first display area, a light transmittance of the first display area being greater than that of the second display area, the first display area including: a pixel layer, including multiple first pixels; an anode layer, adjacent to the pixel layer, and the anode layer including multiple reflective anodes electrically connected to the multiple first pixels in one-to-one correspondence; a light-transmitting insulating layer, arranged a side of the anode layer facing away the pixel layer; multiple light-transmitting wires, each of the multiple light-transmitting wires being electrically connected to one or more of the multiple reflective anodes, and the multiple light-transmitting wires being spaced from each other; and multiple light-transmitting filling blocks, each of the multiple light-transmitting filling blocks being arranged between each two spaced light-transmitting wires of the multiple light-transmitting wires, and differences in optical parameters of each of the multiple light-transmitting filling blocks and optical parameters of each of the multiple light-transmitting wires being smaller than differences in optical parameters of the light-transmitting insulating layer and the optical parameter of each of the multiple light-transmitting wires, respectively.

In an embodiment of the present disclosure, each of the multiple light-transmitting wires has a first refractive index and a first extinction coefficient, each of the multiple light-transmitting filling blocks has a second refractive index and a second extinction coefficient, and the light-transmitting insulating layer has a third refractive index and a third extinction coefficient; and a difference between the first refractive index and the second refractive index is smaller than a difference between the first refractive index and the third refractive index, and a difference between the first extinction coefficient and the second extinction coefficient is smaller than a difference between the first extinction coefficient and the third extinction coefficient.

In an embodiment of the present disclosure, the first refractive index is equal to the second refractive index, and the first extinction coefficient is equal to the second extinction coefficient.

In an embodiment of the present disclosure, the multiple light-transmitting wires are arranged in the anode layer, and the multiple light-transmitting wires are spaced from the multiple reflective anodes.

In an embodiment of the present disclosure, the multiple light-transmitting wires, the multiple light-transmitting filling blocks, and the multiple reflective anodes are arranged on the light-transmitting insulating layer; and thicknesses of the multiple light-transmitting wires, the multiple light-transmitting filling blocks, and the multiple reflective anodes are equal.

In an embodiment of the present disclosure, the multiple light-transmitting wires are arranged on a side of the light-transmitting insulating layer facing away from the anode layer, the light-transmitting insulating layer is provided with via holes, and the multiple light-transmitting wires are electrically connected to the multiple reflective anodes through connecting wires arranged in the via holes.

In an embodiment of the present disclosure, an orthogonal projection of each of the connecting wires on the light-transmitting layer is located within a corresponding one reflective anode of the multiple reflective anodes.

In an embodiment of the present disclosure, the multiple light-transmitting wires, and the multiple light-transmitting filling blocks are adjacent to the light-transmitting insulating layer, and thicknesses of the multiple light-transmitting wires and the multiple light-transmitting filling blocks are equal.

In an embodiment of the present disclosure, an orthogonal projection of each of the multiple first pixels on the anode layer is located within a one corresponding one reflective anode of the multiple reflective anodes.

In an embodiment of the present disclosure, the display apparatus further includes multiple first drive units for driving the first pixels; and the multiple first drive units are arranged in the second display area; or, the display apparatus further includes a non-display area and the multiple first drive units are arranged in the non-display area.

In an embodiment of the present disclosure, the second display area includes multiple second pixels, and a distribution density of the multiple second pixels is greater than that of the multiple first pixels.

In an embodiment of the present disclosure, a material of each of the multiple light-transmitting filling blocks is one of polycarbonate, polymethyl methacrylate, and polyurethane.

In an embodiment of the present disclosure, the first display area further includes a first substrate, a common electrode layer and a second substrate; the first substrate is adjacent to the light-transmitting insulating layer, and located on a side of the light-transmitting insulating layer facing away from the pixel layer; the common electrode layer is adjacent to the pixel layer, and located on a side of the pixel layer facing away from the first substrate; and the second substrate is adjacent to the common electrode layer, and located on a side of the common electrode layer away from the pixel layer.

An embodiment of the present disclosure provide a further display apparatus, including a first display area and a second display area adjacent to the first display area, a light transmittance of the first display area being greater than that of the second display area, the first display area including: a pixel layer, including multiple first pixels; an anode layer, adjacent to the pixel layer, the anode layer including multiple reflective anodes electrically connected to the multiple first pixels in one-to-one correspondence; multiple first drive units, each of the multiple first drive units electrically being connected to one or more of the multiple reflective anodes, and a projection of each of the multiple first drive units on the anode layer is located within one of the multiple reflective anodes; multiple light-transmitting wires, each of the multiple light-transmitting wires being electrically connected to the multiple first drive units, and the multiple light-transmitting wires being spaced from each other; and multiple light-transmitting filling blocks, each of the multiple light-transmitting filling blocks being arranged between each two spaced light-transmitting wires of the multiple light-transmitting wires, and differences in optical parameters of each of the multiple light-transmitting filling blocks and optical parameters of each of the multiple light-transmitting wires being smaller than respective preset parameter thresholds.

An embodiment of the present disclosure provides an electronic device, including: the display apparatus according to any one of the above mentioned embodiments; and a camera including a lens, the lens being arranged facing towards the first display area of the display apparatus, and the camera being configured to acquire an external optical signal transmitted through the first display area for imaging.

The present disclosure provides an electronic device. The electronic device may include a display apparatus and a camera. A lens of the camera is arranged opposite the display apparatus, that is to say, the camera is configured to acquire an external optical signal that passes through the display apparatus for imaging. It can be understood that, a light transmittance of an existing display apparatus is relatively low, and the imaging effect of the camera that images with the light passing through the display apparatus is poor. In view of this, in the present disclosure, the display apparatus is divided into different areas in such a manner that for example a light transmittance of a portion of the display apparatus corresponding to the camera is made greater than a light transmittance of other portions of the display apparatus, which can improve the imaging effect of the camera. The technical solutions in the embodiments of the present disclosure will be clearly and completely described below in conjunction with the drawings in the embodiments of the present disclosure.

The electronic device provided in the embodiments of the present disclosure may be a mobile terminal device such as a mobile phone and a tablet, and may also be a device including a display apparatus, such as gaming device, augmented reality (AR) device, virtual reality (VR) device, vehicle onboard computer, laptop, data storage device, audio display apparatus, video display apparatus, and wearable device, in which the wearable device may be a smart bracelet, smart glasses or the like.

For the convenience of understanding, the following is an example of the electronic device as a mobile phone. Specifically, referring to FIG. 1, a first schematic structural view of an electronic device according to an embodiment of the present disclosure is illustrated. The electronic device 10 includes a display apparatus 20. The display apparatus 20 includes a first display area 220 and a second display area 240. A light transmittance of the first display area 220 is greater than a light transmittance of the second display area 240. The electronic device 10 is provided therein with a camera 60. The camera 60 includes a lens, and the lens of the camera 60 is arranged to face towards the first display area 220. The camera 60 is configured to acquire an external optical signal passing through the first display area 220 for imaging. In other words, the camera 60 is arranged beneath the first display area 220 of the display apparatus 20, and the camera 60 is configured to acquire an external optical signal passing through the first display area 220 of the display apparatus 20, and to produce an image based on the acquired external optical signal. A display area of the display apparatus 20 is an integral area, since no light transmission channel that cannot be used for displaying is provided due to the camera 60, a screen ratio of the display apparatus 20 is improved. It can also be understood that a true full screen is proved, which can display images in full screen. The camera 60 may serve as a front camera of the electronic device 10. The camera 60 may be configured to produce images such as a user's selfie with light passing through the first display area 220 of the display apparatus 20.

In order to more comprehensively understand the display apparatus according to the embodiments of the present disclosure, details of the display apparatus will be described below.

Figure 2:
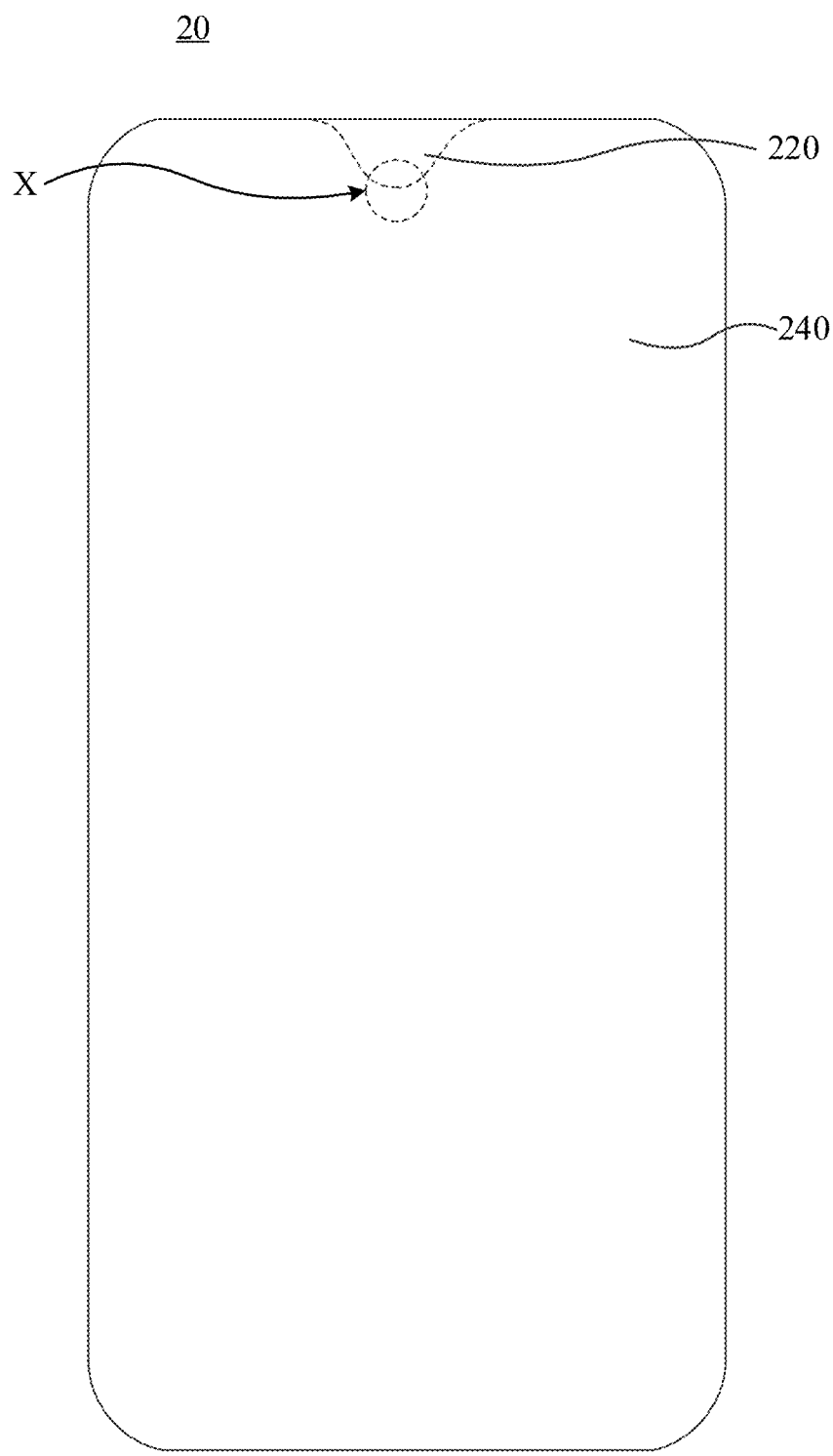
FIG. 2 illustrates a first schematic structural view of a display apparatus of FIG. 1.

Referring to FIG. 2, FIG. 2 illustrates a first schematic structural view of the display apparatus of FIG. 1. The display apparatus 20 may include a first display area 220 and a second display area 240 which adjacent to each other.

The first display area 220 and the second display area 240 may both be configured to display texts or images. The first display area 220 and the second display area 240 may be configured to cooperatively display a same image. For example, the first display area 220 may display a portion of a preset image, and the second display area 240 may display the remaining portion of the preset image. The first display area 220 and the second display area 240 may also be configured to display different images. For example, the first display area 220 may display a taskbar image, and the second display area 240 may display a preset image. The first display area 220 and the second display area 240 may both be configured to display contents. In this way, the display area is complete, and a relatively high screen-to-body ratio of the display apparatus 20 is provided. The second display area 240 may be arranged to surround the first display area 220, and the entire periphery of the first display area 220 may be adjoined to the second display area 240. In other words, the first display area 220 may be located in the middle of the second display area 240. The second display area 240 may be arranged to partially surround the first display area 220, that is, a part of the periphery of the first display area 220 may be adjoined to the second display area 240. For example, the first display area 220 may be located at a corner of the display apparatus 20 or at the middle of the top of the display apparatus 20.

Figure 3:
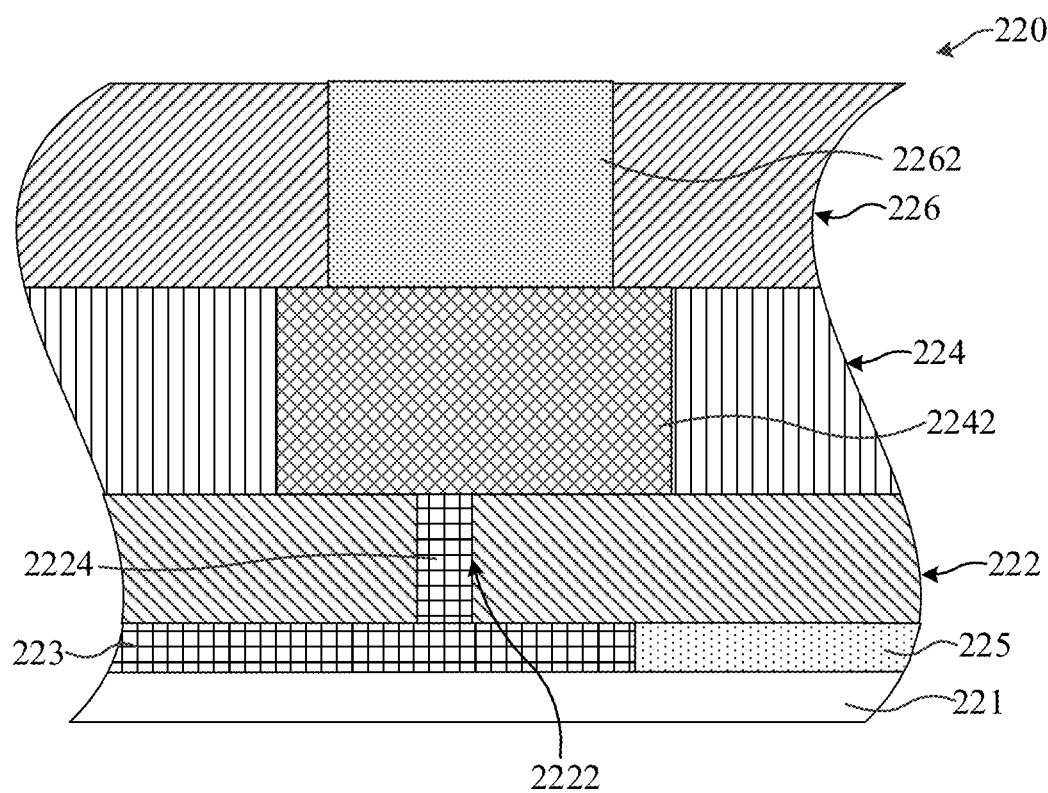
FIG. 3 illustrates a first schematic stacked structure view of the display apparatus of FIG. 2.
Figure 4:
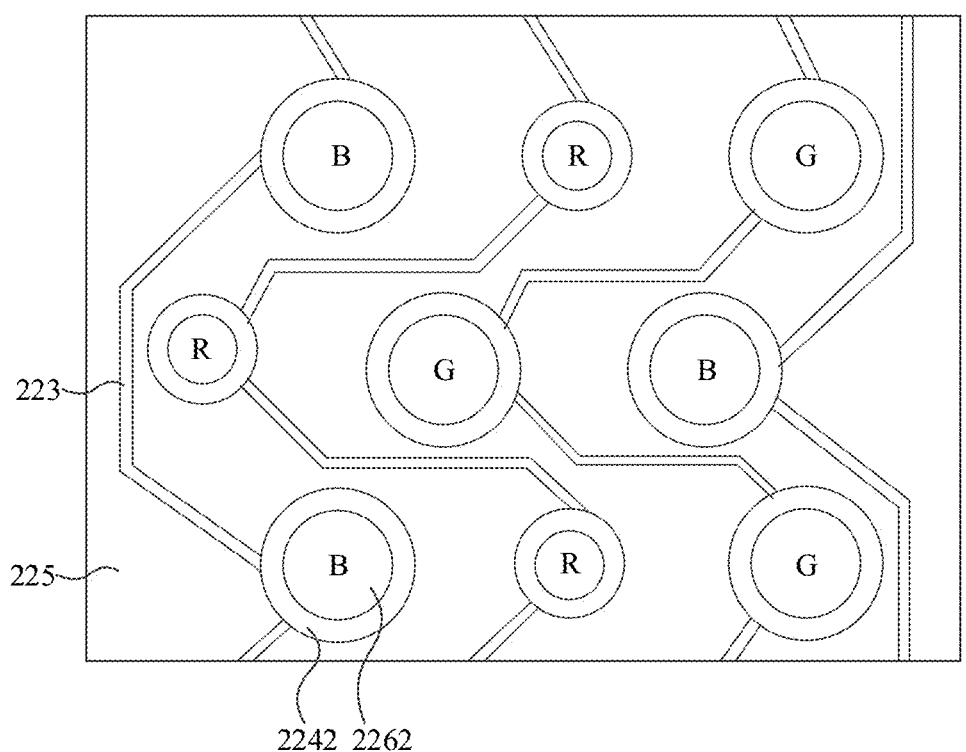
FIG. 4 illustrates a schematic top view of a part of the display apparatus of FIG. 2.

Please refer to FIGS. 3 and 4, FIG. 3 illustrates a first schematic stacked structure view of the display apparatus of FIG. 2 and FIG. 4 illustrates a schematic top view of a part of the display apparatus of FIG. 2.

In an embodiment of the present disclosure, the first display area 220 includes an anode layer 224 and a pixel layer 226.

The pixel layer 226 includes multiple first pixels 2262. Each of the first pixels 2262 is an organic light emitting unit. Each of the first pixels 2262 may include multiple sub-pixels, and the first pixel 2262 may display multiple colors through the cooperation between the multiple sub-pixels. The first pixel 2262 may include three sub-pixels of red, green and blue, or other sub-pixels. The first pixel 2262 includes different numbers of sub-pixels according to arrangement manners of different sub-pixels. For example, the first pixel 2262 may include three sub-pixels of red, green and blue or four sub-pixels red, green, green and blue, or the like, and the number and arrangement of the sub-pixels included in the first pixel 2262 are not limited herein.

The anode layer 224 is adjacent to the pixel layer 226. The anode layer 224 includes multiple reflective anodes 2242. The multiple reflective anodes 2242 are electrically connected to the multiple first pixels 2262, which can also be understood that each reflective anode 2242 is electrically connected with one first pixel 2262 of the multiple first pixels 2262. The reflective anode 2242 can be configured to drive the corresponding first pixel 2262 to emit light, and can also enable an optical signal emitted by the corresponding first pixel 2262 to be sent out, thereby improving a luminous efficiency of the first display area 220. It can be understood that the reflective anode is made of an opaque material, for example, the reflective anode is made of an opaque metal material.

The first display area 220 may be further include multiple light-transmitting wires 223 and multiple light-transmitting filling blocks 225. The multiple light-transmitting wires 223 are electrically connected to the multiple reflective anodes 2242, which can also be understood that each light-transmitting wire 223 is electrically connected to one or more reflective anodes 2242. The multiple light-transmitting wires 223 are used to electrically connect multiple first drive units (not shown) arranged outside the first display area 220 and the multiple first pixels 2262, to enable each first drive unit to drive one or more first pixels 2262. The multiple light-transmitting wires 223 are arranged to be spaced from each other. Because the first drive unit includes light-opaque thin film transistors, the first drive unit for driving the first pixel 2262 is arranged outside the first display area 220, and thus the light transmittance of the first display area 220 can be increased. Further, many traces connected to the first drive unit can also be arranged in the first display area 220, to optimize optical characteristics of the first display area 220. For example, reflection interference and refraction interference caused by the first drive units are reduced, and a layer of the first display area 220 in which the first drive unit is originally arranged becomes simple, and the light can pass through the first display area 220 more uniformly.

Each light-transmitting filling block 225 is arranged between two spaced light-transmitting wires 223, which can also be understood that the multiple light-transmitting filling blocks 225 are arranged between the multiple light-transmitting wires 223 spaced from each other, and differences in optical parameters of each of the light-transmitting filling blocks 225 and optical parameters of each of the light-transmitting wires 223 are smaller than respective preset parameter thresholds. It can be understood that the light-transmitting wires 223 are configured to transmit electrical signals, the multiple light-transmitting filling blocks 225 are filled between the multiple light-transmitting wires 223 space from each other, and the light-transmitting filling blocks 225 are made of insulating materials.

In the first display area 220, the multiple light-transmitting wires 223 spaced from each other are filled there between with the multiple light-transmitting filling blocks 225, and the differences in the optical parameters of each of the light-transmitting filling blocks 225 and the optical parameters of each of the light-transmitting wires 223 are smaller than the respective preset parameter thresholds, such that when light passes through a layer where the light-transmitting wires 223 are located, a part of the light passes through the light-transmitting wires 223 and a part of the light passes through the light-transmitting filling blocks 225, because the differences in the optical parameters of each of the light-transmitting filling blocks 225 and the optical parameters of each of the light-transmitting wires 223 are smaller than the respective preset parameter thresholds, the light can uniformly pass through the layer where the light-transmitting wires 223 are located, and a diffraction effect will not be caused due to optical differences in the light-transmitting wires 223 and the light-transmitting filling blocks, thus improving the light-transmitting effect of the display apparatus 20. When the camera 60 acquires the external optical signal passing through the first display area 220 for imaging, because the differences in the optical parameters of each of the light-transmitting wires 223 and the optical parameters of each of the light-transmitting filling block are smaller than the respective preset parameters thresholds, the diffraction effect will not be caused, so that a very good imaging effect can be achieved, and a quality of an image shot by the camera 60 through the first display area 220 is improved. It can also be understood that when light passes through the layer where the light-transmitting wires 223 are located, no diffraction effect will be caused due to the optical differences in the light-transmitting wires 223 and the light-transmitting filling blocks, which can be considered that the differences in the optical parameters of each of the light-transmitting filling blocks 225 and the optical parameters of each of the light-transmitting wires 223 are smaller than the respective preset parameter thresholds. It can be understood that the first display area 220 can be divided into a light-transmitting area and a non-light-transmitting area, an area of the first display area 220 corresponding to the opaque reflective anode 2242 is the non-light-transmitting area, and the other area of the first display area is the light-transmitting area. The camera 60 acquires the external optical signal passing through the light-transmitting area of the first display area 220 for imaging.

Optical characteristics of a material mainly include a refractive index and an extinction coefficient, which can be expressed by a complex number n1=n+ik, where n1 represents a complex refractive index, n represents a common refractive index, and k represents the extinction coefficient.

Specifically, the optical parameters of the light-transmitting wire 223 include a first refractive index and a first extinction coefficient, and the optical parameters of the light-transmitting filling block 225 include a second refractive index and a second extinction coefficient. The differences in the optical parameters of the light-transmitting filling block 225 and the optical parameters of the light-transmitting wire 223 are smaller than the respective preset parameter thresholds, which means that the first refractive index and the second refractive index are equal or a difference between the first refractive index and the second refractive index is smaller than a preset refractive index threshold, and the first extinction coefficient and the second extinction coefficient are equal or a difference between the first extinction coefficient and second extinction coefficient is smaller than a preset extinction coefficient threshold.

A material of the light-transmitting wire 223 can be Indium Tin Oxides (ITO), which has a good conductivity and a light transmission, and the light transmittance of ITO in visible light area is above 80%. By adjusting a proportion of indium oxide and a preparation process of ITO, the light transmittance of ITO in the visible light area can even reach above 90%. A refractive index of the ITO is between 1.5 and 2.5, and an extinction coefficient of the ITO is between 0.4 and 0.8 due to the preparation process of the ITO, a microstructure of the ITO, a post-treatment process of the ITO, the proportion of indium oxide in the ITO and the proportion of tin in the ITO. Since the light-transmitting wire 223 of the first display area 220 is made of the ITO, it has a good light transmittance and a good conductivity. Therefore, based on the first refractive index and the first extinction coefficient of the ITO, an appropriate material can be selected to form the light-transmitting filling blocks 225, that is to say, the appropriate material is selected such that the second refractive index of this material is equal to the first refractive index of the ITO or a difference between the second refractive index of this material and the first refractive index of the ITO is smaller than the preset refractive index threshold, and the second extinction coefficient of this material is equal to the first extinction coefficient of the ITO or a difference between the second extinction coefficient and the first extinction coefficient the preset extinction coefficient threshold, so that the light will have no diffraction effect when passing through the light-transmitting filling blocks 225 and the light-transmitting wires 223. Specifically, the preset refractive index threshold can be set as required, and can be set as 0.3, 0.2 or 0.1, and the preset extinction coefficient threshold can also be set as required, and can be set as 0.2, 0.1 or 0.05.

It can be understood that, in order to improve the light transmittance of the first display area 220, the light transmittance of the light-transmitting filling blocks 225 must meet a certain condition. For example, the light transmittance of the light-transmitting filling blocks 225 should be greater than 70%, 80% or other values. A material of each of the light-transmitting filling blocks 225 may be one of polycarbonate, polymethyl methacrylate, polyurethane, and the like. It should be noted that, the material of the light-transmitting filling block 225 is not limited to the polycarbonate, the polymethyl methacrylate, the polyurethane, and the like. As long as differences in optical parameters of the light-transmitting filling block 225 and optical parameters of the ITO are smaller than respective preset parameter thresholds, an insulating material with a high light transmittance can be used as the material of the light-transmitting filling block 225 of the embodiments of the present disclosure, and the material of the light-transmitting filling block 225 is not limited herein.

It should be noted that the material of the light-transmitting filling block 225 can be selected such that the refractive index thereof is in a range from 1.5 to 2.5 and the extinction coefficient thereof is in a range from 0.4 to 0.8, and then the refractive index and the extinction coefficient of the ITO can be adjusted according to the refractive index and the extinction coefficient of the material of the light-transmitting filling block 225 by adjusting a preparation process of the ITO, a microstructure of the ITO, a post-treatment process of the ITO, a proportion of indium oxide of the ITO, a proportion of tin of the ITO, etc, such that differences in the optical parameters of the ITO and the optical parameters of the light-transmitting filling block 225 are smaller than respective preset parameter thresholds, the first refractive index of the ITO is equal to the second refractive index of the light-transmitting filling block 225 or a difference between the first refractive index of the ITO and the second refractive index of the light-transmitting filling block 225 is smaller than a preset extinction coefficient threshold and the first extinction coefficient of the ITO is equal to the second extinction coefficient of the light-transmitting filling block 225, or a difference between the first extinction coefficient of the ITO and the second extinction coefficient of the light-transmitting filling block 225 is smaller than a preset extinction coefficient threshold, and thus no diffraction effect can be caused when light passes through the light-transmitting filling blocks 225 and the light-transmitting wires 223.

In an embodiment of the present disclosure, the optical parameters of the light-transmitting filling blocks 225 and the light-transmitting conductive wires 223 may be the same. It should be noted that the optical parameters of the light-transmitting filling blocks 225 and the light-transmitting wires 223 being the same can be understood to be approximately the same. In other words, as long as no diffraction effect is caused when the light passes through the light-transmitting filling blocks 225 and the light-transmitting wires 223, it can be considered that the optical parameters of the light-transmitting filling blocks 225 and the light-transmitting wires 223 are the same, and it is not required to force the optical parameters of the light-transmitting filling blocks 225 and the light-transmitting wires 223 to be exactly the same.

It can be understood that the optical parameters of the light-transmitting wires 223 can include the first refractive index and the first light transmittance, and the optical parameters of the light-transmitting filling blocks 225 can include the second refractive index and the second light transmittance. The optical parameters of the light-transmitting filling blocks 225 and the light-transmitting wires 223 are the same, which means that the first refractive index is equal or close to the second refractive index, and the first light transmittance is equal or close to the second light transmittance.

The first display area 220 may further include a first substrate 221, which can be used as a carrier of other layers of the first display area 220. The first substrate 221 may be formed of a material such as glass or resin. A light-transmitting insulating layer 222 between the first substrate 221 and the anode layer 224. It can also be understood that the light-transmitting insulating layer 222 is adjacent to the anode layer 224, and is arranged on a side of the anode layer 224 facing away from the pixel layer 226.

The multiple light-transmitting wires 223 may be arranged on a side of the light-transmitting insulating layer 222 facing away from the anode layer 224, the light-transmitting insulating layer 222 is provided with via holes 2222, and the light-transmitting wires 223 are electrically connected to the multiple reflective anodes 2242 through connecting wires 2224 arranged in the via holes 2222. The multiple light-transmitting wires 223 and the multiple reflective anodes 2242 are located on opposite sides of the light-transmitting insulating layer 222, so there is more space for the multiple light-transmitting wires 223 to be arranged. In addition, the multiple light-transmitting wires 223 can be located on the same layer or at a roughly horizontal position with the first drive units arranged outside the first display area 220, which facilitates the electrical connection between the light-transmitting wires 223 and the first drive units.

In an embodiment of the present disclosure, an orthogonal projection of each of the connecting wires on the light-transmitting layer is located within a corresponding one reflective anode 2242 of the reflective anodes 2242. Considering that the multiple reflective anodes are opaque, the external optical signal enters the first display area 220 and does not pass through the connecting wires located below the multiple reflective anodes 2242. Even if optical parameters of the connecting wires are different from that of the light-transmitting insulating layer 222 surrounding the connecting wires, the connecting wires will not affect the external optical signal. Of course, the connecting wires can also be arranged in other positions. For example, the orthogonal projection of each of the connecting wires on the light-transmitting layer is located outside the corresponding one reflective anode 2242 of the reflective anodes 2242 or partially coincides with the corresponding one reflective anode 2242 of the reflective anodes 2242, and a material of the connecting wires can be selected to be a material having the same or similar optical parameters of the light-transmitting insulating layer 222.

The light-transmitting wires 223 and the light-transmitting filling blocks 225 are adjacent to the light-transmitting insulating layer 222, and thicknesses of the light-transmitting wires 223 and the light-transmitting filling blocks 225 are the same.

In an embodiment of the present disclosure, the first substrate 221 is a flat substrate, that is, a surface of the first substrate 221 used to carry other layer is a flat surface, and the light-transmitting insulating layer 222 is arranged on the first substrate 221, and two surfaces of the light-transmitting insulating layer 222 are also flat surfaces. The light-transmitting wires 223 and the light-transmitting filling blocks 225 are adjacent to the light-transmitting insulating layer 222, that is to say, the light-transmitting wires 223 and light-transmitting filling blocks 225 are arranged on the light-transmitting insulating layer 222. Because the surface of the light-transmitting insulating layer 222 adjacent to the light-transmitting wires 223 and the light-transmitting filling blocks 225 is a flat surface, if the thicknesses of the light-transmitting wires 223 and the light-transmitting filling blocks 225 are the same, when the light can pass through the light-transmitting wires 223 and the light-transmitting filling blocks 225 with the same thicknesses and the same optical parameters, no diffraction effect can be caused, and thicknesses of other layer structures at different positions will not be different, and the optical performance difference will not be caused when an optical signal passes through other layers.

It can be understood that the light-transmitting wires may be directly arranged on the first substrate, or another insulating layer may be arranged between the light-transmitting wires and the first substrate.

Figure 5:
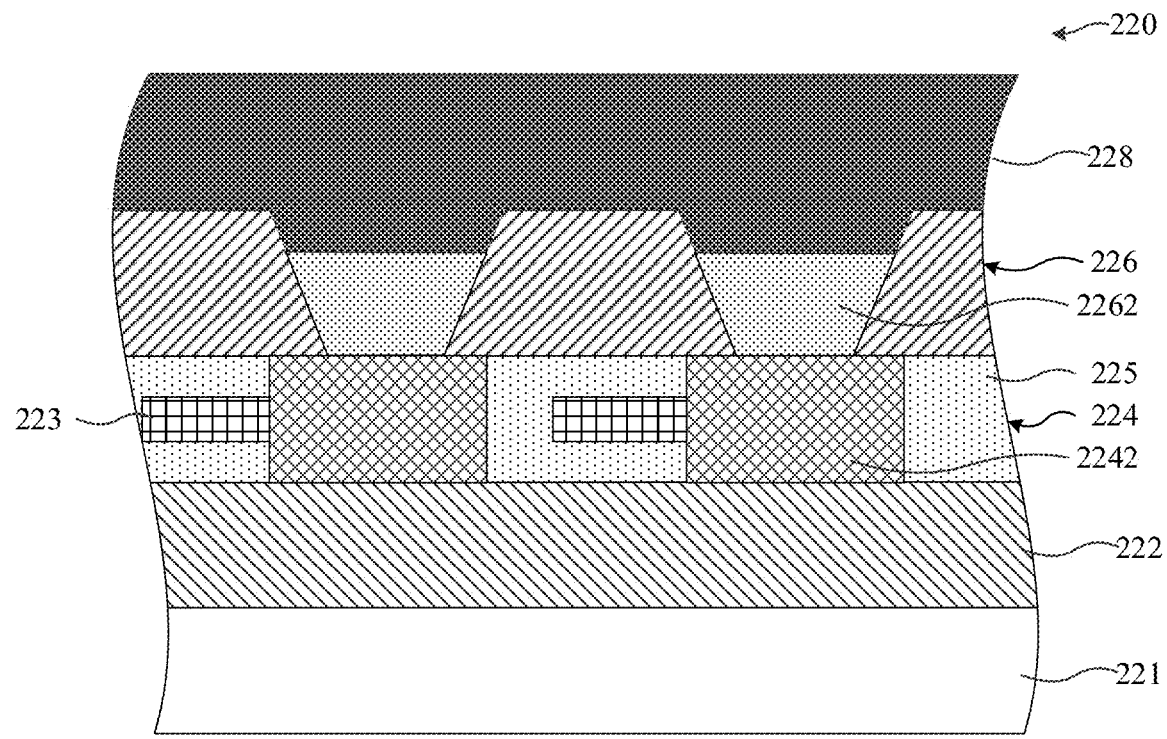
FIG. 5 illustrates a second schematic stacked structure view of the display apparatus of FIG. 2.

It should be noted that the light-transmitting wires can also be arranged at other positions. Please refer to FIG. 5, FIG. 5 illustrates a second schematic stacked structure view of the display apparatus of FIG. 2. The light-transmitting wires 223 may be also be arranged in the anode layer 224, that is to say, the light-transmitting wires 223 are arranged in the same layer as the reflective anodes 2242. The light-transmitting wires 223 are arranged to be spaced from each other, and the reflective anodes 2242 are arranged to be spaced with each other, so that it is more convenient to electrically connect the light-transmitting wires 223 the reflective anodes 2242, and no via hole connection is required. Further, the light-transmitting insulating layer 222 can be arranged between the anode layer 224 and the first substrate 221, that is to say, merely the light-transmitting insulating layer 222 is required to be arranged between the first substrate 221 and the anode layer 224, and the whole layer structure of the first display area 220 is simple and convenient to manufacture.

Similarly, the first substrate 221 is a flat substrate, that is, a surface of the first substrate 221 used for bearing other layers is a flat surface. The light-transmitting insulating layer 222 is arranged on the first substrate 221, and two surfaces of the light-transmitting insulating layer 222 are also flat surfaces. The anode layer 224 is adjacent to the light-transmitting insulating layer 222, that is to say, the light-transmitting wires 223, the light-transmitting filling blocks 225 and the reflective anodes 2242 are all arranged on the light-transmitting insulating layer 222. Because the surface of the light-transmitting insulating layer 222 adjacent to the anode layer 224 is a flat surface, if the thicknesses of the light-transmitting wires 223 and the light-transmitting filling blocks 225 are the same, when the light can pass through the light-transmitting wires 223 and the light-transmitting filling blocks 225 with the same thickness and the same optical parameters, no diffraction effect can be caused, and thicknesses of other layer structures at different positions will not be different, and the optical performance difference will not be caused when an optical signal passes through other layers. In addition, the light-transmitting wires 223, the light-transmitting filling blocks 225 and the reflective anodes 2242 have the same thicknesses, so that other layers on the anode layer 224, such as the pixel layer 226, can be conveniently arranged.

Each of the first pixels 2262 is made of an organic material. The first pixel 2262 has a good light transmittance, that is to say, an external optical signal can pass through the first pixel 2262. If the first pixels 2262 is arranged to be spaced from the reflective anodes 2242, the light transmittance of the first display area 220 will be hardly affected. However, in order to improve a display brightness of the first display area 220, the reflective anodes 2242 can be arranged directly below the first pixels 2262, and sizes of the reflective anodes 2242 are larger than or equal to that of the first pixels 2262, which can also be understood that orthogonal projection of each first pixel 2262 on the anode layer 224 is located within a corresponding one reflective anode 2242, so that the optical signal emitted by the first pixel 2262 can be sent as much as possible, and a better display brightness can be obtained. In addition, the first pixel 2262 includes multiple sub-pixels of different colors, and optical parameters of the sub-pixels of different colors are different. If the camera 60 acquires the external optical signal transmitted through the first pixel 2262 for imaging, it is difficult to process optical signals transmitted through the sub-pixels of different colors, and the optical signals not transmitted through the first pixel 2262 are also processed. Therefore, the orthogonal projection of each first pixel 2262 on the anode layer 224 is located within the corresponding one reflective anode 2242, which can improve the uniformity of lights transmitted through the first display area 220 and the quality of imaging through the first display area 220.

Figure 6:
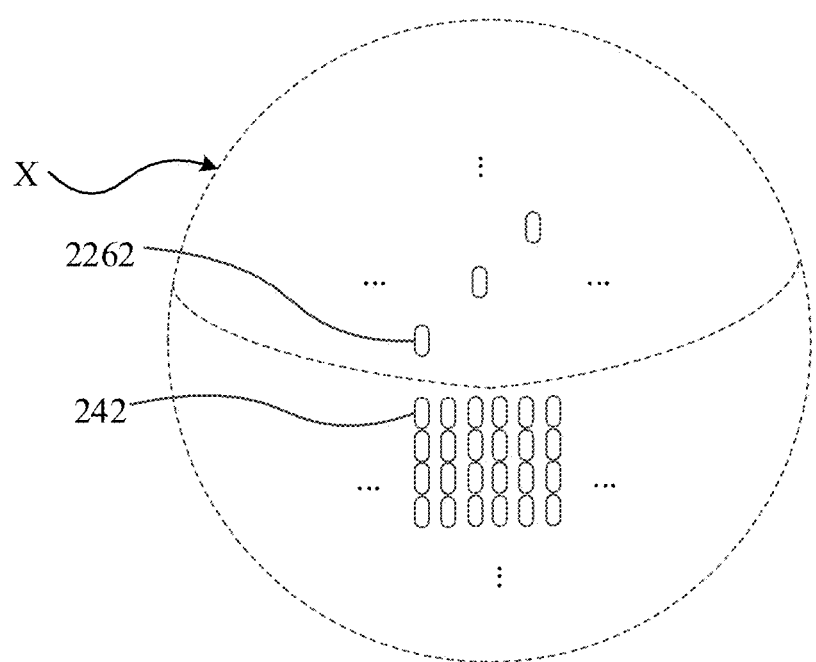
FIG. 6 illustrates a first enlarged schematic view of a portion X of FIG. 2.
Figure 7:
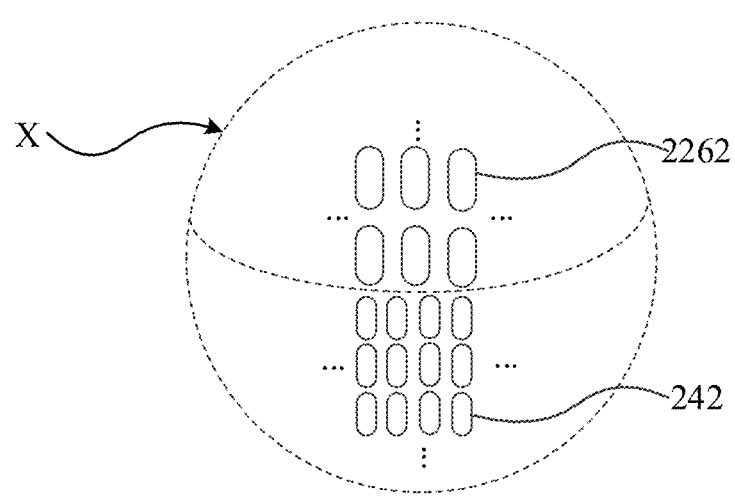
FIG. 7 illustrates a second enlarged schematic view of the portion X of FIG. 2.

The second display area includes multiple second pixels, a distribution density of which is greater than that of the first pixels. For example, please refer to FIG. 6, FIG. 6 illustrates a first enlarged schematic view of a portion X of FIG. 2. The size of the second pixel 242 may be the same as that of the first pixel 2262, and a spacing between adjacent first pixels 2262 of the first display area 220 is larger than a spacing between adjacent second pixels 242 of the second display area 240, which can improve the light transmittance of the first display area 220. For example, the distribution density of the first pixels 2262 in the first display area 220 is 200 Pixels Per Inch (ppi), and the distribution density of the second pixels 242 in the second display area 240 can be more than 400 ppi. In another example, please refer to FIG. 7, FIG. 7 illustrates a second enlarged schematic view of the portion X of FIG. 2. The size of the first pixel 2262 in the first display area 220 may be larger than the size of the second pixel 242 in the second display area 240, and the spacing between the adjacent first pixels 2262 is proportional to the size of the first pixel 2262, that is, the larger the size of the first pixel 2262, the larger the spacing distance between the two adjacent first pixels 2262, so the distribution density of the first pixels 2262 in the first display area 220 is smaller than the distribution density of the second pixel 242 in the second display area.

It can be understood that the distribution density of the first pixels in the first display area is smaller than that of the second pixels in the second display area. The smaller the distribution density of the first pixels, the greater the proportion of areas with higher light transmittance among the first pixels, thereby making the light transmittance of the first display area is greater than that of the second display area. Furthermore, the first drive units for driving the first pixels are arranged in the first display area, and the second drive units for driving the second pixels are arranged in the second display area, so that the light transmittance of the first display area is larger than that of the second display area.

Figure 8:
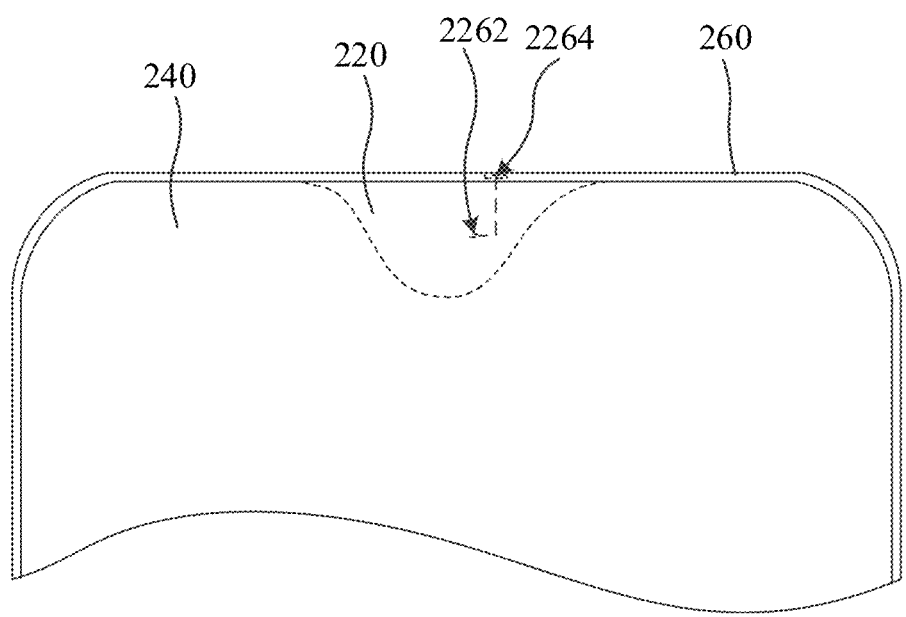
FIG. 8 illustrates a schematic structural view of a part of the display apparatus of FIG. 2.

Please refer to FIG. 8, FIG. 8 illustrates a schematic structural view of a part of the display apparatus of FIG. 2. The display apparatus 20 may further include a non-display area 260, such as an edge position of the display apparatus 20. The first drive unit 2264 arranged outside the first display area 220 can be arranged in the non-display area 260, which can improve the light transmittance of the first display area 220 without affecting the second display area 240.

Figure 9:
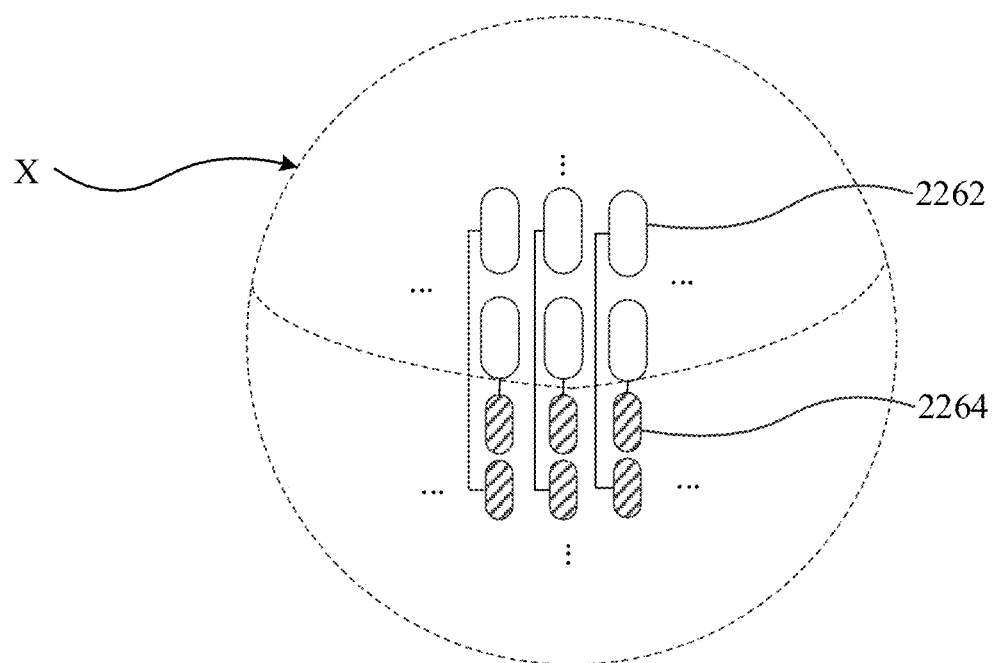
FIG. 9 illustrates a third enlarged schematic view of the portion X of FIG. 2.

Please refer to FIG. 9, FIG. 9 illustrates a third enlarged schematic view of the portion X of FIG. 2.

The first drive units 2264 arranged outside the first display area 220 may also be arranged in the second display area 240. For example, each first drive unit 2264 is provided between the second drive units. The first drive units 2264 can be better arranged on the second display area, and each of the first drive units 2264 can adopt a simple drive circuit. For example, the first drive unit 2264 can adopt a 2T1C or 5T1C drive circuit, and each of the second drive units adopts a 7T1C drive circuit, so as to obtain a better driving effect.

In some embodiments of the present disclosure, the first pixels of the first display area and the second pixels of the second display area have the same size, but in order to reduce the number of thin film transistors (TFT) in the first drive units for driving the first pixels of the first display area, the first pixels may be arranged in parallel, thereby reducing the number of TFTs in the first drive units and facilitating the first drive units to be arranged in the second display area. The second display area may include a transition area, which is adjacent to the first display area. The second pixels in the transition area are arranged in parallel, and each second drive unit in the transition area can drive more than two second pixels connected in parallel, thereby vacating a part of space, and the vacated part of space can be used for arranging the first drive units.

An embodiment of the present disclosure provides another display apparatus. The main difference between the display apparatus in this embodiment and the display apparatus in the above embodiments is in the light-transmitting filling blocks. Specifically, please continue to refer to FIGS. 1 to 9. In the embodiment of the present disclosure, the display apparatus 20 includes a first display area 220 and a second display area 240 which are adjacent to each other. A light transmittance of the first display area 220 is greater than that of the second display area 240. The first display area 220 includes a pixel layer 226, an anode layer 224, a light-transmitting insulating layer 222, multiple light-transmitting wires 223, and multiple light-transmitting filling blocks 225.

The pixel layer 226 includes multiple first pixels 2262. A structure of the pixel layer 226 can be referred to the structure of the pixel layer 226 in any of the above embodiments, which will not be repeated herein.

The anode layer 224 is adjacent to the pixel layer 226. The anode layer 224 includes multiple reflective anodes 2242, which are electrically connected with the multiple first pixels 2262. It can also be understood that each reflective anode 2242 is electrically connected with one first pixel 2262. A structure of the anode layer 224 can be referred to the structure of the anode layer 224 in any of the above embodiments, which will not be repeated herein.

The light-transmitting insulating layer 222 is arranged on a side of the anode layer 224 facing away from the pixel layer 226. A structure of the light-transmitting insulating layer 222 can be referred to the structure of the light-transmitting insulating layer 222 in any of the above embodiments, which will not be repeated herein.

The light-transmitting wires 223 are electrically connected to the reflective anodes 2242. It can also be understood that each light-transmitting wire 223 is electrically connected to one or more reflective anodes 2242, and the light-transmitting wires 223 are used to electrically connect first drive units 2264 arranged outside the first display area 220 and the first pixels 2262, so that each first drive unit 2264 drives one or more first pixels 2262. The light-transmitting wires 223 are arranged to be spaced from each other. A structure of the light-transmitting wire 223 can refer to the structure of the light-transmitting wire 223 in any of the above-mentioned embodiments, which will not be repeated herein.

Each light-transmitting filling block 225 is arranged between two spaced light-transmitting wires 223, which can also be understood that the light-transmitting filling blocks 225 are arranged between the spaced light-transmitting wires 223, and differences in optical parameters of each of the light-transmitting filling blocks 225 and optical parameters of each of the light-transmitting wires 223 are smaller than differences in the optical parameters of the light-transmitting insulating layer 222 and optical parameters of each of the light-transmitting wires 223, respectively.

In a related art, the light-transmitting wires are arranged in a groove of the light-transmitting insulation layer, the optical parameters of the light-transmitting wires and the optical parameters of the light-transmitting insulation layer are quite different, and the arrangement of the light-transmitting wires is dense and irregular, and the diffraction effect will be caused when the light passes through the light-transmitting wires and the light-transmitting insulation layer. Further, due to complicated routing of the light-transmitting wires, the diffraction effect is irregular, it is more difficult to do a compensation algorithm at a back end, which consumes more computing resources, and it is difficult to completely solve the diffraction effect, which has a great influence on taking pictures and the performance of mobile phones. In the embodiments of the present disclosure, the light-transmitting wires 223 are not arranged in the groove of the light-transmitting insulating layer 222, but the light-transmitting filling blocks 225 are filled in the spaced light-transmitting wires 223, and the differences in the optical parameters of each of the light-transmitting filling blocks 225 and the optical parameters of each of the light-transmitting wires 223 are smaller than the differences in the optical parameters of the light-transmitting insulating layer 222 and the optical parameters of each of the light-transmitting wires 223, respectively, thereby improving the diffraction effect when the light passes through the layer where the light-transmitting wires 223 are located.

In an embodiment of the present disclosure, the optical parameters of the light-transmitting wire 223 include a first refractive index and a first extinction coefficient, the optical parameters of the light-transmitting filling block 225 include a second refractive index and a second extinction coefficient, and the optical parameters of the light-transmitting insulating layer 222 include a third refractive index and a third extinction coefficient. A difference between the first refractive index and the second refractive index is smaller than a difference between the first refractive index and the third refractive index, and a difference between the first extinction coefficient and the second extinction coefficient is smaller than a difference between the first extinction coefficient and the third extinction coefficient.

A material of the light-transmitting wire 223 can be Indium Tin Oxides (ITO), which has a good conductivity and a light transmission, and the light transmittance of ITO in visible light area is above 80%. By adjusting a proportion of indium oxide and a preparation process of ITO, the light transmittance of ITO in the visible light area can even reach above 90%. A refractive index of the ITO is between 1.5 and 2.5, and an extinction coefficient of the ITO is between 0.4 and 0.8 due to the preparation process of the ITO, a microstructure of the ITO, a post-treatment process of the ITO, the proportion of indium oxide in the ITO and the proportion of tin in the ITO. Since the light-transmitting wire 223 of the first display area 220 is made of the ITO, it has a good light transmittance and a good conductivity. A material of the light-transmitting insulating layer 222 can be resin, etc, and a refractive index thereof is between 1.49 and 1.74, and an extinction coefficient thereof is between 0.6 and 1.0. It is difficult for both the refractive index and the extinction coefficient of the light-transmitting insulating layer 222 to be the same as or similar to that of ITO. It should be noted that the material of the light-transmitting insulating layer 222 can also be other materials, such as polyimide. Therefore, based on the first refractive index and the first extinction coefficient of the ITO, and the third refractive index and the third extinction coefficient of the light-transmitting insulating layer, an appropriate material can be selected to form the light-transmitting filler 225, that is to say, to enable that the difference between the first refractive index and the second refractive index is smaller than the difference between the first refractive index and the third refractive index, and the difference between the first extinction coefficient and the second extinction coefficient is smaller than the difference between the first extinction coefficient and the third extinction coefficient, thus improving the diffraction effect caused when a light passes through the layer where the light-transmitting wires 223 are located.

In order to better improve the diffraction effect caused when the light passes through the layer where the light-transmitting wires 223 are located, the second refractive index of the light-transmitting filling block 225 is equal to the first refractive index of the light-transmitting wire 223, and the second extinction coefficient of the light-transmitting filling block 225 is equal to the first extinction coefficient of the light-transmitting wire 223, thereby eliminating the diffraction effect caused when the light passes through the layer where the light-transmitting wires 223 are located.

It can be understood that, in order to improve the light transmittance of the first display area 220, the light transmittance of the light-transmitting filling blocks 225 must meet a certain condition. For example, the light transmittance of the light-transmitting filling blocks 225 should be greater than 70%, 80% or other values. A material of each of the light-transmitting filling blocks 225 may be one of polycarbonate, polymethyl methacrylate, polyurethane, and the like. It should be noted that, the material of the light-transmitting filling block 225 is not limited to the polycarbonate, the polymethyl methacrylate, the polyurethane, and the like. As long as the optical parameters of the light-transmitting filling block 225 are the same as the optical parameters of the ITO, an insulating material with a high light transmittance can be used as the material of the light-transmitting filling block 225 of the embodiments of the present disclosure, and the material of the light-transmitting filling block 225 is not limited herein.

It should be noted that the material of the light-transmitting filling block 225 can be selected such that the refractive index thereof is in a range from 1.5 to 2.5 and the extinction coefficient thereof is in a range from 0.4 to 0.8, and then the refractive index and the extinction coefficient of the ITO can be adjusted according to the refractive index and the extinction coefficient of the material of the light-transmitting filling block 225 by adjusting a preparation process of the ITO, a microstructure of the ITO, a post-treatment process of the ITO, a proportion of indium oxide of the ITO, a proportion of tin of the ITO, etc, such that the optical parameters of ITO are the same as that of the light-transmitting filling block 225, i.e., the first refractive index of the ITO is equal to or close to the second refractive index of the light-transmitting filling block 225, and the first extinction coefficient of the ITO is equal to or close to the second extinction coefficient of the light-transmitting filling block 225, and thus no diffraction effect can be caused when light passes through the light-transmitting filling blocks 225 and the light-transmitting wires 223.

The first display area 220 may further include a first substrate 221, which can be used as a carrier of other layers of the first display area 220. The first substrate 221 may be formed of a material such as glass or resin. A light-transmitting insulating layer 222 between the first substrate 221 and the anode layer 224. It can also be understood that the light-transmitting insulating layer 222 is adjacent to the anode layer 224, and is arranged on a side of the anode layer 224 facing away from the pixel layer 226.

The multiple light-transmitting wires 223 may be arranged on a side of the light-transmitting insulating layer 222 facing away from the anode layer 224, the light-transmitting insulating layer 222 is provided with via holes, and the light-transmitting wires 223 are electrically connected to the multiple reflective anodes 2242 through connecting wires arranged in the via holes. The multiple light-transmitting wires 223 and the multiple reflective anodes 2242 are located on opposite sides of the light-transmitting insulating layer 222, so there is more space for the multiple light-transmitting wires 223 to be arranged. In addition, the multiple light-transmitting wires 223 can be located on the same layer or at a roughly horizontal position with the first drive units 2264 arranged outside the first display area 220, which facilitates the electrical connection between the light-transmitting wires 223 and the first drive units 2264.

In an embodiment of the present disclosure, an orthogonal projection of the each of connecting wires on the light-transmitting layer is located within a corresponding one reflective anode 2242 of the reflective anodes 2242. Considering that the multiple reflective anodes are opaque, the external optical signal enters the first display area 220 and does not pass through the connecting wires located below the multiple reflective anodes 2242. Even if optical parameters of the connecting wires are different from that of the light-transmitting insulating layer 222 surrounding the connecting wires, the connecting wires will not affect the external optical signal. Of course, the connecting wires can also be arranged in other positions. For example, the orthogonal projection of each of the connecting wires on the light-transmitting layer is located outside the respective reflective anode 2242 or partially coincides with the respective reflective anode 2242, and a material of each of the connecting wires can be selected to be a material having the same or similar optical parameters of the light-transmitting insulating layer 222.

The light-transmitting wires 223 and the light-transmitting filling blocks 225 are adjacent to the light-transmitting insulating layer 222, and thicknesses of the light-transmitting wires 223 and the light-transmitting filling blocks 225 are the same.

In an embodiment of the present disclosure, the first substrate 221 is a flat substrate, that is, a surface of the first substrate 221 used to carry other layer is a flat surface, and the light-transmitting insulating layer 222 is arranged on the first substrate 221, and two surfaces of the light-transmitting insulating layer 222 are also flat surfaces. The light-transmitting wires 223 and the light-transmitting filling blocks 225 are adjacent to the light-transmitting insulating layer 222, that is to say, the light-transmitting wires 223 and light-transmitting filling blocks 225 are arranged on the light-transmitting insulating layer 222. Because the surface of the light-transmitting insulating layer 222 adjacent to the light-transmitting wires 223 and the light-transmitting filling blocks 225 is a flat surface, if the thicknesses of the light-transmitting wires 223 and the light-transmitting filling blocks 225 are the same, when the light can pass through the light-transmitting wires 223 and the light-transmitting filling blocks 225 with the same thicknesses and the same optical parameters, no diffraction effect can be caused, and thicknesses of other layer structures at different positions will not be different, and the optical performance difference will not be caused when an optical signal passes through other layers.

It can be understood that the light-transmitting wires 223 may be directly arranged on the first substrate 221, or another insulating layer may be arranged between the light-transmitting wires 223 and the first substrate 221.

It should be noted that the light-transmitting wires 223 may be also be arranged in the anode layer 224, that is to say, the light-transmitting wires 223 are arranged in the same layer as the reflective anodes 2242. The light-transmitting wires 223 are arranged to be spaced from each other, and the reflective anodes 2242 are arranged to be spaced with each other, so that it is more convenient to electrically connect the light-transmitting wires 223 the reflective anodes 2242, and no via hole connection is required. Further, the light-transmitting insulating layer 222 can be arranged between the anode layer 224 and the first substrate 221, that is to say, merely the light-transmitting insulating layer 222 is required to be arranged between the first substrate 221 and the anode layer 224, and the whole layer structure of the first display area 220 is simple and convenient to manufacture.

Similarly, the first substrate 221 is a flat substrate, that is, a surface of the first substrate 221 used for bearing other layers is a flat surface. The light-transmitting insulating layer 222 is arranged on the first substrate 221, and two surfaces of the light-transmitting insulating layer 222 are also flat surfaces. The anode layer 224 is adjacent to the light-transmitting insulating layer 222, that is to say, the light-transmitting wires 223, the light-transmitting filling blocks 225 and the reflective anodes 2242 are all arranged on the light-transmitting insulating layer 222. Because the surface of the light-transmitting insulating layer 222 adjacent to the anode layer 224 is a flat surface, if the thicknesses of the light-transmitting wires 223 and the light-transmitting filling blocks 225 are the same, when the light can pass through the light-transmitting wires 223 and the light-transmitting filling blocks 225 with the same thickness and the same optical parameters, no diffraction effect can be caused, and thicknesses of other layer structures at different positions will not be different, and the optical performance difference will not be caused when an optical signal passes through other layers. In addition, the light-transmitting wires 223, the light-transmitting filling blocks 225 and the reflective anodes 2242 have the same thicknesses, so that other layers on the anode layer 224, such as the pixel layer 226, can be conveniently arranged.

An orthographic projection of each first pixel 2262 on the anode layer 224 is located within one reflective anode 2242. The structures of the first pixels 2262, the anode layer 224, and the reflective anodes 2242 can refer to the structures of any of the above embodiments, which will not be repeated herein.

It can be understood that the display apparatus 20 may further include a non-display area 260, and the first drive unit 2264 may be arranged in the non-display area 260, and the first drive unit 2264 may also be arranged in the second display area 240. The structure and position of the first drive units 2264 and the structure and position of the second drive units can be those of the first drive units 2264 and the second drive units in any of the above-mentioned embodiments, which will not be repeated herein.

The second display area 240 includes multiple second pixels 242, and a distribution density of the multiple second pixels 242 is greater than that of the first pixels 2262. The structure and distribution of the first pixels 2262 and the structure and distribution of the second pixels 242 can be those of the first pixels 2262 and the second pixels 242 in any of the above embodiments, which will not be repeated herein.

It should be noted that the first display area 220 includes a first substrate 221, a light-transmitting insulating layer 222, an anode layer 224, a pixel layer 226, a common electrode layer, and a second substrate sequentially arranged. The first substrate 221 is adjacent to the light-transmitting insulating layer 222, and located on a side of the light-transmitting insulating layer 222 facing away from the pixel layer 226. The common electrode layer is adjacent to the pixel layer 226, and located on a side of the pixel layer 226 facing away from the first substrate 221. The second substrate is adjacent to the common electrode layer, and located on a side of the common electrode layer facing away from the pixel layer 226. The common electrode layer and the reflective anodes are used to jointly drive the first pixels 2262 in the pixel layer 226 to display. The first drive units 2264 for driving the first pixels 2262 can be arranged outside the first display area 220, which can improve the light transmittance of the first display area 220. Moreover, the layer structure of the first display area 220 is simple, which is convenient for the light to transmit the first display area 220 uniformly.

An embodiment of the present disclosure provides a further display apparatus. The main difference between the display apparatus in this embodiment and the display apparatus in the above embodiments in the first drive units. Referring to FIGS. 1 to 9, the display apparatus 20 in the embodiment of the present disclosure includes a first display area 220 and a second display area 240 which are adjacent to each other, and a light transmittance of the first display area 220 is greater than a of the second display area 240. The first display area 220 includes a pixel layer 226, an anode layer 224, multiple first drive units 2264, multiple light-transmitting wires 223, and multiple light-transmitting filling blocks 225.

The pixel layer 226 includes multiple first pixels 2262. The structure of the pixel layer 226 can be referred to the structure of the pixel layer 226 in any of the above embodiments, which will not be repeated herein.

The anode layer 224 is adjacent to the pixel layer 226. The anode layer 224 includes multiple reflective anodes 2242, which are electrically connected with the multiple first pixels 2262 in one-to-one correspondence. It can also be understood that each reflective anode 2242 is electrically connected with a first pixel 2262. The structure of the anode layer 224 can be referred to the structure of the anode layer 224 in any of the above embodiments, and will not be described in detail here.

Each first drive unit 2264 is electrically connected to one or more reflective anodes 2242, and drives the first pixel 2262 through the one or more reflective anodes 2242. The projection of each first drive unit 2264 on the anode layer 224 is located within one reflective anode 2242.

Each light-transmitting wire 223 is electrically connected to the first drive unit 2264, and the light-transmitting wires 223 are arranged to be spaced from each other. The structure of the light-transmitting wires 223 can refer to the structure of the light-transmitting wires 223 in any of the above-mentioned embodiments, which will not be repeated herein.

Each light-transmitting filling block 225 is arranged between two spaced light-transmitting wires 223, and the differences in the optical parameters of each of the light-transmitting filling block 225 and optical parameters of each of the light-transmitting wires 223 are smaller than respective preset parameter thresholds. Optical characteristics of a material mainly include a refractive index and an extinction coefficient, which can be expressed by a complex number n1=n+ik, where n1 represents a complex refractive index, n represents a common refractive index, and k represents the extinction coefficient. In an embodiment of the present disclosure, the optical parameters of the light-transmitting wire 223 include a first refractive index and a first extinction coefficient, and the optical parameters of the light-transmitting filling block 225 include a second refractive index and a second extinction coefficient. The differences in the optical parameters of the light-transmitting block 225 and the optical parameters of the light-transmitting wire 223 are smaller than the respective preset parameter thresholds, which means that the first refractive index and the second refractive index are equal or a difference between the first refractive index and the second refractive index is smaller than a preset refractive index threshold, and the first extinction coefficient and the second extinction coefficient are equal or a difference between the first extinction coefficient and second extinction coefficient is smaller than a preset extinction coefficient threshold. The structure of the light-transmitting wires 223 can refer to the structures of the light-transmitting wire in any of the above-mentioned embodiments, which will not be repeated herein. The structure of the light-transmitting filling blocks 225 can be referred to the structure of the light-transmitting filling blocks 225 in any of the above embodiments, which will not be repeated herein. Specifically, the preset refractive index threshold can be set as required, and can be set as 0.3, 0.2 or 0.1, and the preset extinction coefficient threshold can also be set as required, and can be set as 0.2, 0.1 or 0.05.

The first drive units 2264 for driving the first pixels 2262 can also be arranged in the first display area 220, but in order not to affect the optical characteristics of the first display area 220, the first drive units 2264 are arranged below the reflective anodes 2242, that is to say, the projections of the first drive units 2264 on the anode layer 224 are located within the reflective anodes 2242, and an external optical signal cannot illuminate the first drive units 2264, and the first drive units 2264 will not generate refraction interference, reflection interference and the like. It should be noted that the light-transmitting wires 223 in this embodiment can electrically connect a drive chip for driving the first display area 220 to the first drive units 2264. The first display area 220 can include a layer structure such as a drive circuit layer, the first drive units 2264 can be arranged on the drive circuit layer, and the light-transmitting wires 223 can be arranged on the drive circuit layer. Connecting wires electrically connecting the first drive units 2264 with the reflective anodes can be arranged below the reflective anodes. The structure of the connecting wires can be the same as that of the light-transmitting wires, or may be adopt other structures, such as an opaque structure, etc.

It should be noted that the structure of the first pixels 2262 in this embodiment of the present disclosure can adopt the corresponding structure in any one of the above embodiments, which will not be repeated herein.

Figure 10:
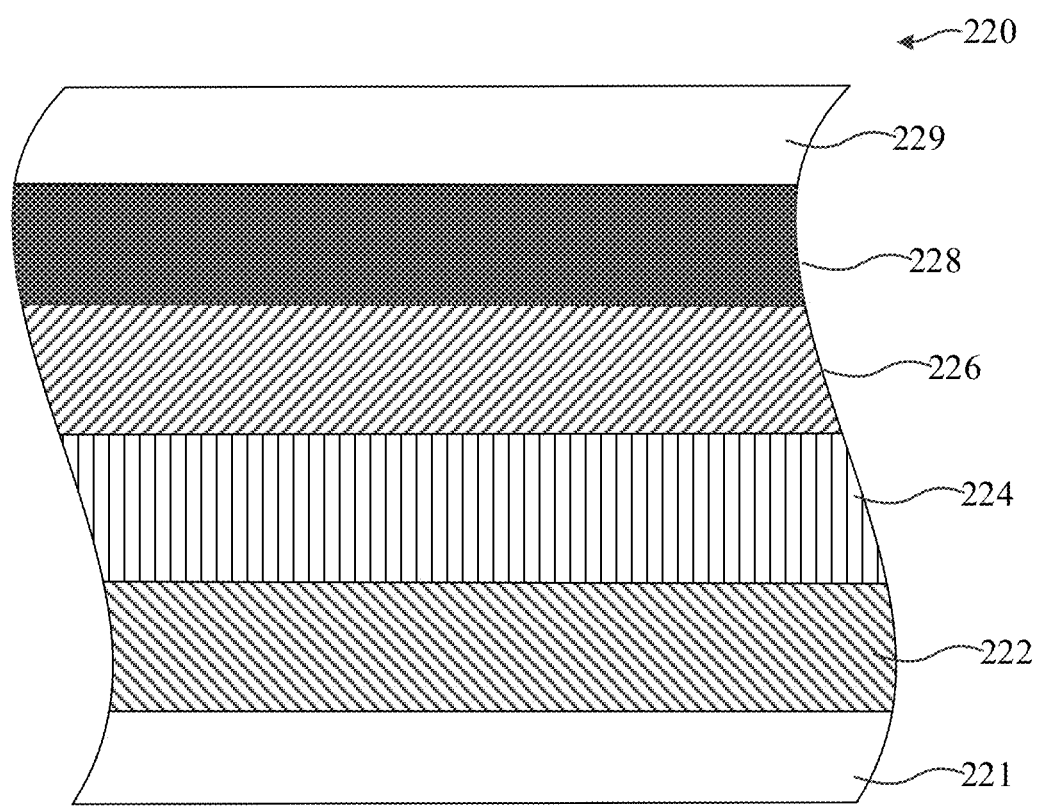
FIG. 10 illustrates a third schematic stacked structure view of the display apparatus of FIG. 2.

Please refer to FIG. 10, FIG. 10 illustrates a third schematic stacked structure view of the display apparatus of FIG.

2. The first display area 220 includes a first substrate 221, a light-transmitting insulating layer 222, an anode layer 224, a pixel layer 226, a common electrode layer 228, and a second substrate 229 sequentially arranged. In an embodiment of the present disclosure, the first substrate 221 is adjacent to the light-transmitting insulating layer 222 and located on a side of the light-transmitting insulating layer 222 facing away from the pixel layer 226. The common electrode layer 228 is adjacent to the pixel layer 226, and located on a side of the pixel layer 226 facing away from the first substrate 221. The second substrate 229 is adjacent to the common electrode layer 228, and located on a side of the common electrode layer 228 facing away from the pixel layer 226. The common electrode layer 228 and the reflective anodes are used to jointly drive the first pixels of the pixel layer 226 to display. The first drive units for driving the first pixels can be arranged outside the first display area 220, which can improve the light transmittance of the first display area 220. Further, the layer structure of the first display area 220 is simple, which is convenient for the light to transmit to the first display area 220 uniformly. In some embodiments of the present disclosure, a part of the layer structure may be adjusted as required, for example, the first display area may not be provided with the second substrate.

It can be understood that the light-transmitting wires and the light-transmitting filling blocks may be arranged between the pixel layer and the first substrate. The embodiment of the present disclosure does not limit the specific positions of the light-transmitting wires and the light-transmitting filling blocks. For example, the light-transmitting wires and the light-transmitting filling blocks may be arranged on the anode layer, or may be arranged between the light-transmitting insulating layer and the first substrate.

Figure 11:
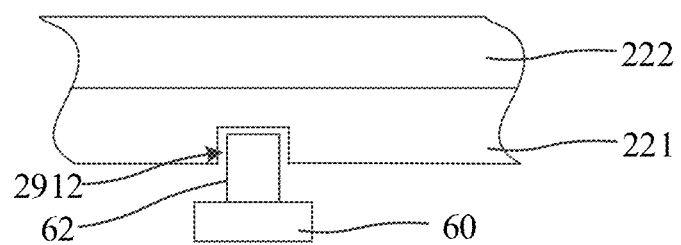
FIG. 11 illustrates a first schematic structural view of a display apparatus and a camera according to an embodiment of the present disclosure.

The lens of the camera in the electronic device faces towards the first substrate of the display apparatus. The camera is configured to acquire the external optical signal passing through the first display area for imaging. In order to reduce a space occupied by the camera, the lens of the camera may be arranged to be close to or adjacent to the first substrate of the display apparatus. The first substrate of the display apparatus is mainly configured to carry the other layers of the display apparatus, and the first substrate itself does not require any special functions. Therefore, in order to further reduce the space occupied by the camera, a portion of the camera may be provided in the first substrate. Specifically, referring to FIG. 11, FIG. 11 is a first schematic structural view of a display apparatus and a camera according to an embodiment of the present disclosure. A first installation hole 2912 is provided in the first substrate at a position corresponding to the camera 60, and at least a part of the camera 60 is provided in this first installation hole 2912. The first installation hole 2912 may be a blind hole. In other words, a thickness of a portion of the first substrate corresponding to the camera 60 is smaller than a thickness of the other portion of the first substrate, and the first substrate is still a complete substrate. This not only does not affect the function of the first substrate in carrying the other layers of the display apparatus 20, but also frees up a space to accommodate the camera 60. The installation of the first installation hole 2912 and the camera 60 may be set according to ae size of the first installation hole 2912 and a size of the camera 60. For example, in a case where a space of the first installation hole 2912 is not enough to mount the entire camera 60, the lens 62 of the camera 60 is partially arranged in the first installation hole 2912. In a case where the camera 60 is small enough, the entire camera 60 is arranged in the first installation hole 2912.

Figure 12:
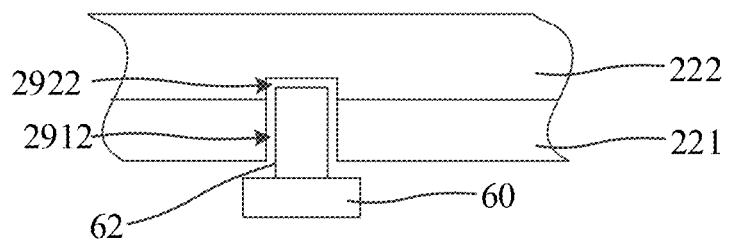
FIG. 12 illustrates a second schematic structural view of a display apparatus and a camera according to an embodiment of the present disclosure.

Because the first display area is not required to be provided with the first drive units, the layers of the first display area is simple, and there is no complicated circuit, so the camera can be installed in other layers of the first display area, such as a light-transmitting insulating layer. Referring to FIG. 12, a second schematic structural view of a display apparatus and a camera according to an embodiment of the present disclosure is illustrated. The first installation hole 2912 is a through hole, and the light-transmitting insulating layer of the first display area defines a second installation hole 2922 at a position corresponding to the camera 60. The first installation hole 2912 and the second installation hole 2922 are communicated with each other, and at least a part of the camera 60 may be arranged in the second installation hole 2922. For example, the lens 62 of the camera 60 may be located in both the first installation hole 2912 and the second installation hole 2922. The second installation hole 2922 may be a through hole or a blind hole. The first installation hole 2912 and the second installation hole 2922 may be produced after a portion of the stacked structure of the display apparatus 20 is formed. For example, after the light-transmitting insulating layer, the anode layer, the pixel layer, and the common electrode layer of the display apparatus 20 are all arranged on the substrate, the first installation hole 2912 and the second installation hole 2922 are produced at the positions corresponding to the lens 62 of the camera 60, by using a laser and the like.

It should be noted that the camera 60 arranged opposite the first display area can serve as a front camera 60 of the electronic device. The front camera is generally a camera with an immovable lens. By providing the first installation hole 2912 and the second installation hole 2922 on the substrate and the light-transmitting insulating layer of the display apparatus respectively, the camera 60 arranged opposite the first display area can make lens 62 of the camera 60 move, for realizing functions such as autofocus.

One or more cameras may be provided below the first display area. The multiple cameras can work cooperatively. For example, two identical cameras may be provided, including a normal camera and a camera with shallow depth of field or a monochrome camera, etc. In addition to the camera, other functional devices can be further provided below the first display area, such as a proximity sensor, a light sensor, a distance sensor, and a fingerprint recognition sensor.

It can be understood that the size and shape of the first pixels of the first display area can be set as desired in any one of the above embodiments. For example, the first pixel may be rectangular or circle-like. The circle-like shaped first pixel may include a circle first pixel, an ellipse first pixel, or a rounded rectangle-shaped first pixel, etc. The rounded rectangle-shaped first pixel enables the diffraction of the first display area to be alleviated, due to curved transitions defined at the edges of the circle-like shaped first pixels.

The display apparatus may be in a regular shape, such as a rectangle, a rounded rectangle, or a circle. Obviously, in some other possible embodiments, the display apparatus can also be in an irregular shape, which is not limited in the embodiments of the present disclosure.

In order to understand the electronic device in the embodiments of the present disclosure more comprehensively, the structure of the electronic device will be further described in the following. Referring to FIG. 1, the electronic device 10 further includes a housing 40 and the camera 60.

The housing 40 may include a rear cover (not shown) and a frame 420. The frame 420 surrounds a periphery of the rear cover. The display apparatus 20 is arranged in the frame 420. The display apparatus 20 and the rear cover can be two opposite sides of the electronic device 10. The camera 60 is arranged between the rear cover of the housing 40 and the display apparatus 20. The display apparatus 20 may be an organic light-emitting diode (OLED) display apparatus. The display apparatus 20 may be a full-screen. In other words, all the entire display areas of the display apparatus 20 are substantially configured for displaying. The display apparatus 20 may further be provided thereon with a cover plate. The cover plate covers the display apparatus 20 to protect the display apparatus 20, so as to prevent the display apparatus 20 from being scratched or damaged by water. The cover plate can be a light-transmitting glass cover plate, so that the user can see the information displayed on the display apparatus 20 through the cover plate. For example, the cover plate can be a glass cover plate made of sapphire crystal.

The electronic device may further include a circuit board, a battery and a middle plate. The frame 420 is arranged around the middle plate. The frame 420 and the middle plate may form a middle frame of the electronic device 10. Accommodating spaces are defined on both sides of the middle plate by the middle frame and the frame 420. One of the accommodating spaces is configured to accommodate the display apparatus 20, and the other accommodating space is configured to accommodate the circuit board, the battery, and other electronic components or functional assemblies of the electronic device 10.

In an embodiment of the present disclosure, the middle plate can be in a thin plate-like or sheet-like structure, or can be a hollow frame structure. The middle frame is configured to provide support for the electronic components or functional components in the electronic device 10, so that the electronic components and the functional components in the electronic device 10 can be mounted together. The functional components such as the camera 60, a receiver, the circuit board, the battery, and the like of the electronic device 10 can be mounted on the middle frame or the circuit board for fixing. It can be understood that a material of the middle frame can include metal or plastic, etc.

The circuit board can be mounted on the middle frame. The circuit board may be a main board of the electronic device 10. One or more functional components such as a microphone, a speaker, a receiver, a headphone interface, an acceleration sensor, a gyroscope, a processor and the like can be integrated on the circuit board. Meanwhile, the display apparatus 20 can be electrically connected to the circuit board to control the display of the display apparatus 20 by the processor on the circuit board. Both of the display apparatus 20 and the camera 60 can be electrically connected to the processor. In response to receiving a shooting command, the processor controls the display of the light-transmitting area to be turned off and controls the camera 60 to capture an image through the first display area. In response to receiving a command to display an image, the processor controls the second display area and the first display area to cooperatively display the image.

The battery can be mounted on the middle frame. Meanwhile, the battery is electrically connected to the circuit board, such that the battery supplies power to the electronic device 10. The circuit board may be provided with a power management circuit. The power management circuit is configured to distribute voltage provided by the battery to various electronic components in the electronic device 10.

It should be understood that the term "multiple" in the present disclosure means two or more.

The display apparatus and the electronic device provided in the embodiments of the present disclosure have been described in detail above. Specific examples are used herein to explain the principles and implementations of the present disclosure. The descriptions of the above embodiments are only used to facilitate the understanding of the present disclosure. In addition, for those skilled in the art, there may be modifications in the specific embodiments and in the scope of the present disclosure according to the concept of the present disclosure. In summary, the content of the description should not be construed as limitations of the present disclosure.

What is claimed is:

1. A display apparatus, comprising a first display area and a second display area adjacent to the first display area, a light transmittance of the first display area being greater than that of the second display area, the first display area comprising:
   a pixel layer, comprising a plurality of first pixels;
   an anode layer, adjacent to the pixel layer, and the anode layer comprising a plurality of reflective anodes electrically connected to the plurality of first pixels in one-to-one correspondence;
   a plurality of light-transmitting wires, each of the plurality of light-transmitting wires being electrically connected to one or more of the plurality of reflective anodes, and the plurality of light-transmitting wires being spaced from each other; and
   a plurality of light-transmitting filling blocks, each of the plurality of light-transmitting filling blocks being arranged between each two spaced light-transmitting wires of the plurality of light-transmitting wires, and differences in optical parameters of each of the plurality of light-transmitting filling blocks and optical parameters of each of the plurality of light-transmitting wires being smaller than respective preset parameter thresholds;
   wherein the first display area further comprises a light-transmitting insulating layer, and the light-transmitting insulating layer is adjacent to the anode layer and arranged on a side of the anode layer facing away from the pixel layer; and
   wherein the plurality of light-transmitting wires are arranged on a side of the light-transmitting insulating layer facing away from the anode layer, the light-transmitting insulating layer is provided with via holes, and the plurality of light-transmitting wires are electrically connected to the plurality of reflective anodes through connecting wires arranged in the via holes.

2. The display apparatus according to claim 1, wherein the optical parameters of each of the plurality of light-transmitting wires comprise a first refractive index and a first extinction coefficient, and the optical parameters of each of the plurality of light-transmitting filling blocks comprise a second refractive index and a second extinction coefficient; and
   wherein the first refractive index is equal to the second refractive index, or a difference between the first refractive index and the second refractive index is smaller than a preset refractive index threshold.

3. The display apparatus according to claim 2, wherein the first extinction coefficient is equal to the second extinction coefficient, or a difference between the first extinction coefficient and the second extinction coefficient is smaller than a preset extinction coefficient threshold.

4. The display apparatus according to claim 1, wherein the display apparatus further comprises a plurality of first drive units, each of the plurality of first drive units electrically being connected to one or more of the plurality of reflective anodes, and a projection of each of the plurality of first drive units on the anode layer is located within one of the plurality of reflective anodes.

5. A display apparatus, comprising a first display area and a second display area adjacent to the first display area, a light transmittance of the first display area being greater than that of the second display area, the first display area comprising:
 a pixel layer, comprising a plurality of first pixels;
 an anode layer, adjacent to the pixel layer, and the anode layer comprising a plurality of reflective anodes electrically connected to the plurality of first pixels in one-to-one correspondence;
 a light-transmitting insulating layer, arranged a side of the anode layer facing away the pixel layer;
 a plurality of light-transmitting wires, each of the plurality of light-transmitting wires being electrically connected to one or more of the plurality of reflective anodes, and the plurality of light-transmitting wires being spaced from each other; and
 a plurality of light-transmitting filling blocks, each of the plurality of light-transmitting filling blocks being arranged between each two spaced light-transmitting wires of the plurality of light-transmitting wires, and differences in optical parameters of each of the plurality of light-transmitting filling blocks and optical parameters of each of the plurality of light-transmitting wires being smaller than differences in optical parameters of the light-transmitting insulating layer and the optical parameters of each of the plurality of light-transmitting wires, respectively;
 wherein a material of each of the plurality of light-transmitting filling blocks is one of polycarbonate, polymethyl methacrylate, and polyurethane.

6. The display apparatus according to claim 5, wherein the optical parameters of each of the plurality of light-transmitting wires comprise a first refractive index and a first extinction coefficient, the optical parameters of each of the plurality of light-transmitting filling blocks comprise a second refractive index and a second extinction coefficient, and the optical parameters of the light-transmitting insulating layer comprise a third refractive index and a third extinction coefficient; and
 a difference between the first refractive index and the second refractive index is smaller than a difference between the first refractive index and the third refractive index.

7. The display apparatus according to claim 6, wherein the first refractive index is equal to the second refractive index, and the first extinction coefficient is equal to the second extinction coefficient.

8. The display apparatus according to claim 6, wherein a difference between the first extinction coefficient and the second extinction coefficient is smaller than a difference between the first extinction coefficient and the third extinction coefficient.

9. The display apparatus according to claim 5, wherein the plurality of light-transmitting wires are arranged in the anode layer, and the plurality of light-transmitting wires are spaced from the plurality of reflective anodes.

10. The display apparatus according to claim 9, wherein the plurality of light-transmitting wires, the plurality of light-transmitting filling blocks, and the plurality of reflective anodes are arranged on the light-transmitting insulating layer; and thicknesses of the plurality of light-transmitting wires, the plurality of light-transmitting filling blocks, and the plurality of reflective anodes are equal.

11. The display apparatus according to claim 5, wherein the plurality of light-transmitting wires are arranged on a side of the light-transmitting insulating layer facing away from the anode layer, the light-transmitting insulating layer is provided with via holes, and the plurality of light-transmitting wires are electrically connected to the plurality of reflective anodes through connecting wires arranged in the via holes.

12. The display apparatus according to claim 11, wherein the plurality of light-transmitting wires, and the plurality of light-transmitting filling blocks are adjacent to the light-transmitting insulating layer, and thicknesses of the plurality of light-transmitting wires and the plurality of light-transmitting filling blocks are equal.

13. The display apparatus according to claim 5, wherein an orthogonal projection of each of the plurality of first pixels on the anode layer is within a corresponding one reflective anode of the plurality of reflective anodes.

14. The display apparatus according to claim 5, wherein the display apparatus further comprises a plurality of first drive units for driving the plurality first pixels; and
 wherein the plurality of first drive units are arranged in the second display area; or, the display apparatus further comprises a non-display area and the plurality of first drive units are arranged in the non-display area.

15. The display apparatus according to claim 5, wherein the second display area comprises a plurality of second pixels, and a distribution density of the plurality of second pixels is greater than that of the plurality of first pixels.

16. The display apparatus according to claim 5, wherein the first display area further comprises a first substrate, a common electrode layer and a second substrate; the first substrate is adjacent to the light-transmitting insulating layer, and located on a side of the light-transmitting insulating layer facing away from the pixel layer; the common electrode layer is adjacent to the pixel layer, and located on a side of the pixel layer facing away from the first substrate; and the second substrate is adjacent to the common electrode layer, and located on a side of the common electrode layer away from the pixel layer.

17. The display apparatus according to claim 5, wherein each of the plurality of light-transmitting filling blocks is filled between each two spaced light-transmitting wires of the plurality of light-transmitting wires.

18. An electronic device, comprising:
 a display apparatus, comprising a first display area and a second display area adjacent to the first display area, a light transmittance of the first display area being greater than that of the second display area, the first display area comprising:
  a pixel layer, comprising a plurality of first pixels;
  an anode layer, adjacent to the pixel layer, and the anode layer comprising a plurality of reflective anodes electrically connected to the plurality of first pixels in one-to-one correspondence;
  a plurality of light-transmitting wires, each of the plurality of light-transmitting wires being electrically connected to one or more of the plurality of reflective anodes, and the plurality of light-transmitting wires being spaced from each other; and
  a plurality of light-transmitting filling blocks, each of the plurality of light-transmitting filling blocks being filled between each two spaced light-transmitting wires of the plurality of light-transmitting wires, the plurality of light-transmitting filling blocks being made of insulating materials, and differences in optical parameters of each of the plurality of light-transmitting filling blocks and optical parameters of each of the plurality of light-transmitting wires being smaller than respective preset parameter thresholds; and a camera comprising a lens, the lens being arranged facing towards the first display area of the display apparatus, and the camera being configured to acquire an external optical signal transmitted through the first display area for imaging;

wherein the first display area further comprises a light-transmitting insulating layer, and the light-transmitting insulating layer is adjacent to the anode layer and arranged on a side of the anode layer facing away from the pixel layer; and wherein the plurality of light-transmitting wires are arranged on a side of the light-transmitting insulating layer facing away from the anode layer, the light-transmitting insulating layer is provided with via holes, and the plurality of light-transmitting wires are electrically connected to the plurality of reflective anodes through connecting wires arranged in the via holes.

19. The electronic device according to claim 18, wherein the plurality of light-transmitting wires, and the plurality of light-transmitting filling blocks are adjacent to the light-transmitting insulating layer, and thicknesses of the plurality of light-transmitting wires and the plurality of light-transmitting filling blocks are equal.

20. The electronic device according to claim 18, wherein a material of each of the plurality of light-transmitting filling blocks is one of polycarbonate, polymethyl methacrylate, and polyurethane.

\* \* \* \* \*